(12) United States Patent
Gruenwald et al.

(10) Patent No.: US 10,804,453 B2
(45) Date of Patent: Oct. 13, 2020

(54) PELTIER-ELEMENT

(71) Applicant: Mahle International GmbH, Stuttgart (DE)

(72) Inventors: Juergen Gruenwald, Ludwigsburg (DE); Christian Heneka, Karlsruhe (DE); Dirk Neumeister, Stuttgart (DE)

(73) Assignee: Mahle International GmbH (DE)

( * ) Notice: Subject to any disclaimer, the term of this patent is extended or adjusted under 35 U.S.C. 154(b) by 0 days.

(21) Appl. No.: 15/744,762

(22) PCT Filed: Jul. 7, 2016

(86) PCT No.: PCT/EP2016/066137
§ 371 (c)(1),
(2) Date: Jun. 13, 2018

(87) PCT Pub. No.: WO2017/009172
PCT Pub. Date: Jan. 19, 2017

(65) Prior Publication Data
US 2018/0309040 A1   Oct. 25, 2018

(30) Foreign Application Priority Data

Jul. 15, 2015 (DE) .................. 10 2015 213 294
Apr. 27, 2016 (DE) .................. 10 2016 207 190

(51) Int. Cl.
*H01L 35/30* (2006.01)
*H01L 35/32* (2006.01)
(Continued)

(52) U.S. Cl.
CPC ............. *H01L 35/08* (2013.01); *H01L 35/30* (2013.01); *H01L 35/32* (2013.01); *H01L 35/34* (2013.01)

(58) Field of Classification Search
CPC .................... H01L 35/30; H01L 35/32
See application file for complete search history.

(56) References Cited

U.S. PATENT DOCUMENTS 4,275,259 A      6/1981  Yamamoto et al.
4,980,302 A *   12/1990  Shimizu ................ H01L 29/732
                                                257/E21.151
(Continued)

FOREIGN PATENT DOCUMENTS

DE           2940963 C2    5/1983
DE       102012108591 A1  12/2013
(Continued)

OTHER PUBLICATIONS

English abstract for DE-102012108591.
(Continued)

*Primary Examiner* — Susan D Leong
(74) *Attorney, Agent, or Firm* — Fishman Stewart PLLC (57) ABSTRACT

A Peltier element for a thermoelectric heat exchanger may include n-doped n-type semiconductors, p-doped p-type semiconductors, and a plate structure for electrically contacting the semiconductors. The plate structure may include first plate sections and second plate sections, which may be alternately arranged along an extension of the Peltier element. The first plate sections may form a first side of the Peltier element, and the second plate sections may form a second side of the Peltier element, the second side being spaced from the first side. The plate structure may further include a plurality of legs. Each leg may interconnect adjacent first and second plate sections and may extend inclined relative to the adjacent first and second plate sections. An n-type semiconductor and a p-type semiconductor may be alternately integrated in the legs along the plate structure.

16 Claims, 5 Drawing Sheets

(51) Int. Cl.
*H01L 35/08* (2006.01)
*H01L 35/34* (2006.01)

(56) References Cited

U.S. PATENT DOCUMENTS

| | | | |
|---|---|---|---|
| 6,000,225 A * | 12/1999 | Ghoshal | F25B 21/02 |
| | | | 62/3.7 |
| 6,002,081 A | 12/1999 | Sakuragi | |
| 6,226,994 B1 | 5/2001 | Yamada et al. | |
| 6,385,976 B1 | 5/2002 | Yamamura et al. | |
| 9,698,331 B2 | 7/2017 | Himmer | |
| 2002/0024154 A1 * | 2/2002 | Hara | H01L 23/38 |
| | | | 257/712 |
| 2005/0052848 A1 * | 3/2005 | Hamman | F28D 1/0535 |
| | | | 361/701 |
| 2007/0220902 A1 | 9/2007 | Matsuoka et al. | |
| 2011/0030389 A1 | 2/2011 | Morisaku et al. | |
| 2012/0042640 A1 * | 2/2012 | Limbeck | F01N 5/025 |
| | | | 60/320 |
| 2014/0251408 A1 * | 9/2014 | Dibra | G01K 7/02 |
| | | | 136/242 |
| 2015/0179911 A1 * | 6/2015 | Lemmer | H01L 35/34 |
| | | | 136/212 |
| 2016/0056360 A1 * | 2/2016 | Cho | H01L 35/04 |
| | | | 136/205 |
| 2016/0336503 A1 * | 11/2016 | Kasichainula | H01L 35/34 |

FOREIGN PATENT DOCUMENTS

| | | |
|---|---|---|
| DE | 102012105743 A1 | 1/2014 |
| DE | 102015213294 A1 | 1/2017 |
| EP | 2698833 A1 | 2/2014 |
| JP | 2001274467 A | 10/2001 |
| JP | 200788039 A | 4/2007 |
| WO | WO-2012/095344 A2 | 7/2012 |
| WO | WO-2014135600 A1 | 9/2014 |

OTHER PUBLICATIONS

English abstract for DE-102015213294.
English abstract for JP-200788039.
English abstract for DE-102012105743.
English abstract for JP-2001274467.

* cited by examiner

PELTIER-ELEMENT

CROSS-REFERENCE TO RELATED APPLICATIONS

This application claims priority to International Patent Application No. PCT/EP2016/066137, filed on Jul. 7, 2016, German Patent Application No. DE 10 2015 213 294.3, filed on Jul. 15, 2015, and German Patent Application No. DE 10 2016 207 190.4, filed on Apr. 27, 2016, the contents of all three of which are incorporated herein by reference.

TECHNICAL FIELD

The present invention relates to a Peltier element with alternately arranged n-type semiconductors and p-type semiconductors connected in series. The invention, furthermore, relates to a method for producing such a Peltier element and to a thermoelectric heat exchanger having such a Peltier element.

BACKGROUND

Thermoelectric heat exchangers are employed in numerous applications and allow the pumping of heat from a first to a second side. This pumping of the heat can be employed in particular in order to amplify a heat exchange between the sides or transfer heat from the colder side to the warmer side. Such thermoelectric heat exchangers can comprise a Peltier element for realising the heat pumping. Conventional Peltier elements comprise a multiplicity of p-doped p-type semiconductors and a multitude of n-doped n-type semiconductors, which are alternately arranged and connected in series. For the electrical contacting of adjacent semiconductors, metal plates are usually employed, which are also described as bridges. These metal plates are alternately arranged along the Peltier element along a first and a second side and thus form a first or a second side of the Peltier element.

For the electrical insulation, the respective side is usually provided with a dielectric layer. For the heat exchange, the sides are usually additionally provided with a thermal interface. Here, ceramic plates are generally employed which serve as such thermal interfaces and are electrically insulating. In order to allow in particular a heat exchange with larger objects, associated heat exchangers are usually additionally provided with a plate, which are usually a metal plate and allow a more even heat exchange between the Peltier element and a body that is in heat-exchanging contact with the Peltier element. Such plates or metal plates are usually described as "heat spreaders".

This produces a rigid construction for the conventional Peltier elements and associated thermoelectric heat exchangers which are equipped with such a Peltier element. During the operation of the Peltier element or of the associated heat exchanger, thermally-induced stresses occur within the Peltier element which because of the rigid configuration cannot, or not adequately, be compensated for. In addition, such Peltier elements have an increased thermal resistance between the temperature control partners to be actually temperature controlled, which is caused by the component parts that are present between these partners such as for example the metal bridges, the dielectric layer or the metal plate and result in a low efficiency. Here, such metal plates serve in particular for the purpose of compensating for local temperature differences, so-called hotspots. When in the process larger, in particular larger-area Peltier elements are necessary, the formation of such hotspots can multiply or amplify. This is usually counteracted with thicker metal plates or heat spreaders, but which in turn result in an increase of the thermal resistance and a reduction of the efficiency. The construction of the Peltier element additionally results in a certain minimum thickness of the Peltier element which renders the use of the Peltier element in tight installation spaces that are available difficult or impermissible.

SUMMARY

The present invention therefore deals with the object of stating improved embodiments for a Peltier element, for a method for producing such a Peltier element and for a thermoelectric heat exchanger having such a Peltier element, which are characterized in particular by an increased efficiency and/or a simplified use.

According to the invention, this object is solved through the subjects of the independent claims. Advantageous embodiments are subject of the dependent claims.

The present invention is based on the general idea of electrically connect and thus contact semiconductors of a Peltier element with a plate structure and simultaneously employ the plate structure for the heat transfer. The use of the plate structure results in a flexibility of Peltier element which facilitates the removal of thermal stresses developing during the operation and/or allows a more flexible use of the Peltier element and thus the use of the Peltier element or of an associated heat exchanger in different spatial circumstances and/or in different geometries.

According to the inventive idea, the Peltier element comprises n-doped n-type semiconductors, p-doped p-type semiconductors and the plate structure. The plate structure comprises first plate sections and second plate sections which are alternately arranged along the extent of the Peltier element, wherein the first plate sections form a first side of the Peltier element and the second plate sections form a second side of the Peltier element that is spaced from the first side. In addition, the plate structure comprises multiple legs, wherein the legs along the Peltier element interconnect adjacent plate sections and run inclined, i.e. at an angle, in particular also transversely, to the associated plate sections. This means that in each case such a leg interconnects the plate sections that are adjacent along the Peltier element in such a manner that in each case such a leg connects such a first plate section with such a second plate section and runs inclined relative to these plate sections. Here, the semiconductors of the Peltier element are integrated in the legs of the plate structure spaced relative to one another. This means that along the plate structure alternately such an n-type semiconductor and such a p-type semiconductor are integrated in the legs. The integration of the respective semiconductor in the associated legs is effected in this case in such a manner that n-type semiconductors and p-type semiconductors are alternately arranged along the plate structure and by means of the plate structure are connected in series. In particular, the plate sections are free of semiconductors.

By way of such an arrangement of the plate sections and of the legs, the plate structure and thus the Peltier element thus have an in particular inner corrugated shape which in particular improves the flexibility of the Peltier element.

During the operation of the Peltier element, a voltage is applied to the plate structure and the Peltier element thus energised. The consequence of this is the pumping of heat mentioned at the outset. The direction of the heat flow can be reversed by reversing the energization of the Peltier element. Through the direct integration of the semiconductors in the plate structure, which is employed both for the electrical contacting of the semiconductors and also for the heat transfer, the semiconductors are thus directly integrated in the heat-transferring structure. This results in that additional heat-transferring structures can be omitted or that the number of the heat-transferring structures can be at least reduced. Because of this, the forming of the Peltier element becomes less rigid and/or the thermal resistance within the Peltier element or the associated application, in particular in an associated thermoelectric heat exchanger, is reduced.

The integration of the semiconductors in the plate structure is practically effected in such a manner that no electrical short circuit or bridging bypassing the respective semiconductor is created. This is preferably effected in that the leg for the integration of the semiconductor is electrically interrupted, wherein within this electrical interruption the integration of the semiconductor takes place in such a manner that an electric current through the interruption is exclusively possible via the semiconductor. For said interruption, the leg can comprise two leg sections that are spaced from one another which are in particular bent, wherein the semiconductor is arranged between these leg sections electrically contacting the same.

The first side and the second side of the Peltier element can in principle run in any way provided they are spaced from one another. It is conceivable, in particular, that the respective side has a curved course at least in sections. Configurations are conceivable here in the case of which the first side and the second side do not run parallel to one another at least in sections.

Another thought are embodiments in the case of which the first side and the second side are arranged located opposite one another. Here it is conceivable in particular that the first side and the second side are substantially equidistant along the Peltier element.

Also conceivable are embodiments in the case of which the first plate sections lie in a first plane while the second plate sections are arranged in a second plane that is spaced from the first plane, wherein the planes run in particular parallel. The respective plane to this end can run curved at least in sections.

In the case of preferred embodiments, the first plate sections and the second plate sections are arranged parallel to one another in particular through the parallel arrangement of the first side relative to the second side. This results in particular in a better removal of thermal stresses in the Peltier element. It is preferred, furthermore, when the legs, at least each second leg along the Peltier element, likewise run parallel. This also results in an improvement of the removal of thermal stresses. In particular it is also possible because of this to allow and/or improve the flexibility of the Peltier element in multiple directions and thus a corresponding removal of the thermal stresses in multiple directions and/or an elastic deformation of the Peltier element in multiple directions.

Applying an electric voltage for operating the Peltier element is effected, as mentioned above, via the plate structure. Here, the plate structure advantageously comprises suitable electrical connections on opposite ends, which allow energization the Peltier element. Thus, further component parts and electrical connections of the Peltier element for the energization can be omitted and the construction of the Peltier element or of the associated heat exchanger thus configured simpler and more cost-effectively.

Advantageously, the Peltier element has a thermal insulation between the first side and the second side which prevents or at least reduces a thermal short circuit and thus an unintentional heat flow between the first side and the second side. Thermally insulating means: at least reducing the heat exchange. It is also conceivable to fluidically separate or insulate the first side and the second side from one another.

If one of the sides of the Peltier element during the application of the Peltier element comes into contact with an electrically conductive object or body it is preferred when the associated plate sections are electrically insulated on the relevant side in order to avoid an electrical short circuit in the Peltier element. Such an electrical insulation can be effected in particular by varnish or by varnishing, by anodising and such like.

The respective semiconductor can comprise a single semiconductor element. It is also conceivable that at least one of the semiconductors has multiple semiconductor elements with the same type of doping.

In principle it is conceivable to integrate any number of semiconductors in the respective leg of the Peltier element provided these are alternately arranged.

It is conceivable, in particular, that in the respective leg a single such semiconductor is integrated. In this case, the pumping of heat during the operation of the Peltier element takes place from a side of the Peltier element to the other side of the Peltier element. By reversing the energization of the Peltier element, a reversing of the heat flow can be achieved so that heat is pumped from the second side to the first side.

Another consideration concerns versions in which the Peltier element in the respective leg comprises two such semiconductors, namely one such n-type semiconductor and one such p-type semiconductor. Because of this, heat, depending on the energization of the Peltier element, is pumped from the said sections of the legs on both sides of the Peltier element or, upon reversal of the energization, vice versa.

Here it is preferred when said sections of the legs are arranged in a flow space of the Peltier element through which a fluid to be temperature-controlled can flow. Thus, the fluid can be heated by means of the said sections located between the semiconductors of the respective leg and thus serve as heat sink, while the first side and the second side of the Peltier element are cooled. By reversing the energization of the Peltier element, the fluid can be cooled and thus serve as heat source while both sides of the Peltier element are heated. This allows a particularly efficient temperature control of the fluid.

One such configuration of the Peltier element can be configured in such a manner that the flow space is arranged between the first plate sections and the second plate sections, wherein one of the semiconductors of the respective leg is arranged on the first side outside the flow space and the other semiconductor on the second side outside the flow space. This means that the semiconductors are each arranged outside the flow space.

Here it is particularly preferred when the semiconductors arranged on the first side and the first plate sections and/or the semiconductors arranged on the second side and the second plate sections is/are thermally insulated relative to the flow space and thus result in a more efficient temperature control of the fluid. The thermal insulation in this case can be effected in particular by integration, in particular embedding of the semiconductors arranged on the first side and the first plate sections in a thermally insulating block, wherein the block can delimit the flow space. Similar applies to the semiconductors arranged on the second side and the second plate sections.

In principle, the Peltier element according to the invention can be produced in any way.

Producing the Peltier element is preferably effected by providing a plate that is provided with recesses that are spaced along the plate. The respective recess in this case can be designed as a groove or as an interruption of the plate. Following this, an integration of n-type semiconductors and p-type semiconductors in the recesses takes place wherein the n-type semiconductors and the p-type semiconductors are alternately arranged along the plate. The plate provided with the semiconductors is then formed in such a manner that the plate structure with the semiconductors and thus the Peltier element is created.

For stabilising the plate or the plate structure, the plate can be provided with a carrier plate. The carrier plate is preferentially arranged on one side of the plate of the plate structure. Here, the plate can be provided with the carrier plate prior to the forming and/or prior to the integrating of the semiconductors in the recesses. The carrier plate can be employed in the Peltier element in particular for electrically insulating the plate structure and thus the Peltier element and accordingly be configured to be electrically insulating.

It is also conceivable to employ the carrier plate mainly for the stabilisation during the production of the Peltier element and to remove the same again following the forming of the plate.

Alternatively, integrating the semiconductors in the plate can also take place after the forming of the plate. This means that the plate can also be formed in a first step and the semiconductors are subsequently integrated in the formed plate structure.

In principle, the Peltier element can be employed in any application in order to achieve the pumping of heat.

The Peltier element is preferably provided in a thermoelectric heat exchanger which apart from the Peltier element comprises a first body exchanging heat with the first side of the Peltier element and a second body exchanging heat with the second side of the Peltier element. Accordingly, the respective body can be cooled or heated during the operation and consequently serve as heat source or heat sink.

Here it is preferred when all first plate sections are connected to the first body in a heat transferring manner and/or when all second plate sections are connected to the second body in a heat transferring manner. It is also conceivable to heat-transferringly connect merely a proportion of the first plate sections with the first body and/or merely connect a proportion of the second plate sections to the second body in a heat-transferring manner.

Here, the heat exchanger can be employed in particular for temperature controlling a fluid and/or a temperature control medium. It is also conceivable to employ the heat exchanger for temperature controlling an accumulator or an accumulator cell. It is also conceivable to employ the heat exchanger for air conditioning an interior space, in particular as part of an air conditioning system.

The respective body can be employed during the operation of the heat exchanger for temperature controlling a further object and/or a further fluid or medium.

One of the bodies can for example be flat body for the heat exchange with an object to be cooled, for example an accumulator. Thus, the body is configured in particular as a so-called heat spreader.

At least one of the bodies can, furthermore, be a body through which a temperature control medium can flow, in particular tube body, wherein the temperature control medium is temperature controlled during the operation of the Peltier element or the associated heat exchanger.

Thus, embodiments are conceivable in particular in the case of which one of the bodies exchanges heat with an object, in particular such an accumulator, while the other body exchanges heat with such a temperature control medium, so that during the operation of the heat exchanger the exchange of heat between the temperature control means and the object, in particular the accumulator, materialises. When the heat exchanger is to be employed for cooling one of the bodies and heating the other body, a Peltier element which merely comprises one such semiconductor in the respective leg is preferably employed.

If both bodies are to be employed as heat source or as heat sink, a Peltier element which has two such semiconductors in the respective leg is preferably employed.

Also considered are in particular embodiments in the case of which such a Peltier element with a flow space, which forms a flow space of the heat exchanger, through which fluid can flow, is employed. In the respective leg, two such semiconductors are additionally arranged. Preferably, both bodies are tube bodies through which a temperature control medium, in particular the same temperature control medium can flow. In this way, the fluid flowing through the flow space can exchange heat with the temperature control medium via the tube bodies. The Peltier element can thus replace in particular a rib structure arranged between the tube bodies in order to amplify the heat exchange between the fluid and the temperature control means and/or in order to pump heat from the colder fluid to the warmer temperature control means or vice versa.

It is also conceivable, in particular, that at least one of the bodies is a textile. Because of this, a suitable cooling or heating of the textile can be achieved by means of the Peltier element even when the other side of the Peltier element or the other body is cooler or warmer than the textile. Such a heat exchanger can be employed in particular for air conditioning in a motor vehicle, wherein the textile can be provided for example in the roof of the motor vehicle and/or be a cover of a seat of the motor vehicle. Here, the Peltier element is preferably arranged on the side facing away from the textile.

The heat exchanger can be employed in any application. In particular the use of the heat exchanger in a motor vehicle is to be considered.

The heat exchanger can obviously comprises also two or more such Peltier elements. This allows in particular configuring the heat exchanger in a greater variety, in particular with respect to the size and/or shape or geometry. Because of this it is possible to employ the heat exchanger even in difficult spatial circumstances and/or with complicated profiles of the body to be temperature controlled. It is preferred when at least two of the Peltier elements are electrically connected in series.

Further important features and advantages of the invention are obtained from the subclaims, from the drawings and from the associated figure description by way of the drawings.

It is to be understood that the features mentioned above and still to be explained in the following cannot only be used in the receptive combination stated but also in other combinations or by themselves without leaving the scope of the present invention.

Preferred exemplary embodiments of the invention are shown in the drawings and are explained in more detail in the following description wherein same reference characters relate to same or similar or functionally same components.

BRIEF DESCRIPTION OF THE DRAWINGS

It shows, in each case schematically.

DETAILED DESCRIPTION

Figure 1:
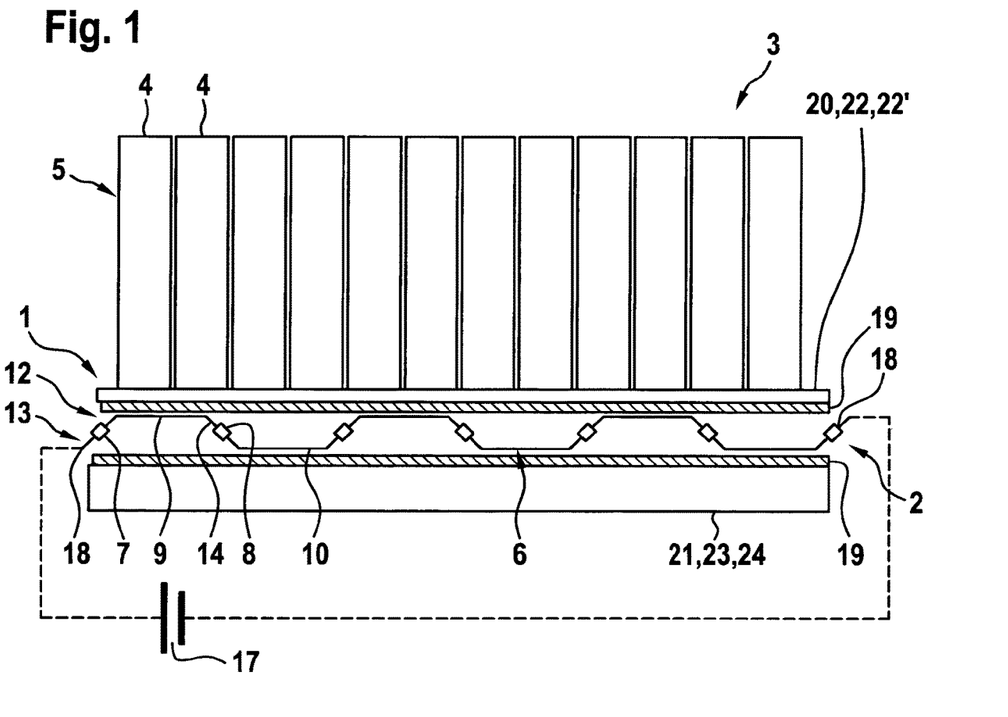
FIG. 1 a section through a thermoelectric heat exchanger with a Peltier element, FIG. 2 the Peltier element from FIG. 1, FIG. 3 the Peltier element with another exemplary embodiment, FIG. 4 the heat exchanger with another exemplary embodiment, FIG. 5 another section through the heat exchanger with a further exemplary embodiment, FIG. 6 the view of the heat exchanger onto FIG. 1 with another exemplary embodiment, FIGS. 7 to 9 different method steps for producing the Peltier element of other exemplary embodiment, FIGS. 10 to 17 an extract of the Peltier element with different exemplary embodiment in each case.
Figure 2:
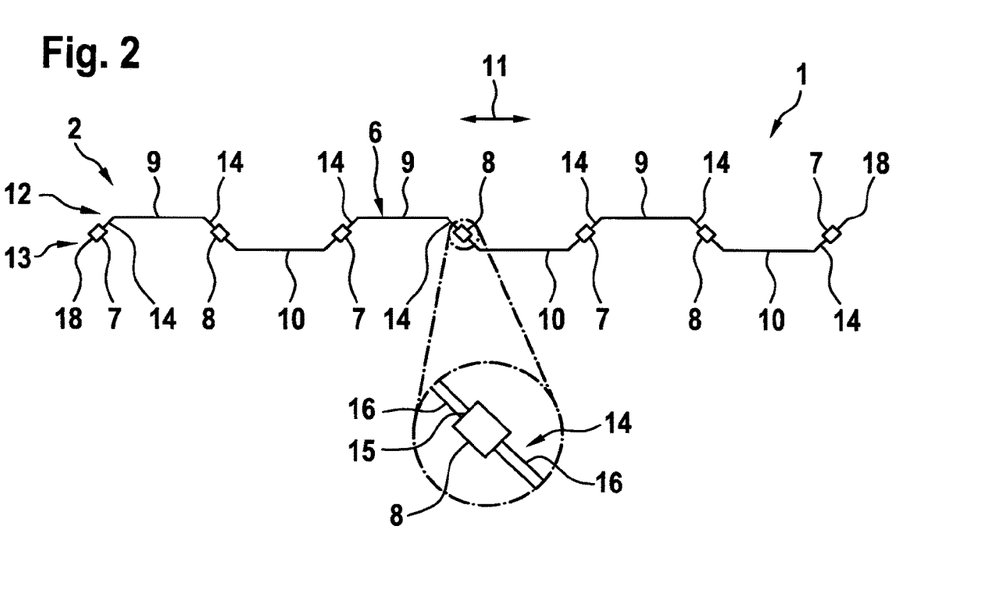

In FIG. 1, a thermoelectric heat exchanger 1 with a Peltier element 2 is shown, which is represented separately in FIG. 2. The heat exchanger 1 is employed in a motor vehicle 3 and serves, in the shown example, for temperature controlling an accumulator 5 comprising multiple cells 4. The Peltier element 2 has a plate structure 6 and a multiplicity of n-doped n-type semiconductors 7 and p-doped p-type semiconductors 8. The plate structure 6 serves for the electrical contacting and/or mechanical connecting of the semiconductors 7, 8 and comprises first plate sections 9 and second plate sections 10, which are alternately arranged along an extent 11 of the Peltier element 2, wherein the first plate sections 9 and the second plate sections 10 in the shown example are arranged in parallel. Here, the first plate sections 9 form a first side 12 and the second plate sections 10 form a second side 13 of the Peltier element 2 which is spaced from the first side 12 and located opposite the first side 12. The plate structure 6, furthermore, comprises legs 14, wherein in each case such a leg 14 interconnects the plate sections 9, 10 which are adjacent along the Peltier element 2 or along the extent 11. This means that the respective leg 14 connects such a first plate section 9 with such a second plate section 10. The semiconductors 7, 8 are alternately integrated in the legs 14 along the plate structure 9. This means that along the plate structure 6 one such n-type semiconductor 7 and one such p-type semiconductor 8 are alternately integrated in the legs 14. The unit consisting of plate structure 6 and semiconductors 7, 8 is thus contiguous. The integration of the semiconductors 7, 8 is effected, as shown in the enlarged representation of FIG. 2, through an interruption or recess 15 of the respective leg 14 in which the semiconductors 7, 8 is arranged in such a manner that an electric current flow in the recess 15 occurs exclusively via the semiconductors 7, 8. In the shown exemplary embodiment, the recess in this case is delimited by spaced leg sections 16 which are in electrical contact with the associated semiconductors 7, 8. Here it is evident that the respective leg 14 runs inclined relative to the associated plate sections 9, 10. Thus, the sides 12, 13 of the Peltier element 2 are spaced from one another.

In the shown exemplary embodiment, a single such semiconductors 7, 8 is integrated in the respective leg 14. Because of this, one such n-type semiconductor 7 and one such p-type semiconductor 8 are alternately integrated in adjacent legs 14 along the Peltier element 2 or the extension direction 11. Here, the legs 14, in which the n-type semiconductors 7 are arranged and the legs 14, in which the p-type semiconductors 8 are arranged, are each arranged in parallel.

Thus, the plate structure 6 is used on the one hand for electrically contacting the semiconductor elements 7, 8 and additionally serves as heat-transferring structure, wherein the heat transfer in the shown example occurs in particular via the plate sections 9, 10. When, as shown in FIG. 1, a voltage via a voltage source 17 is applied to the plate structure 6, which for this purpose is provided with electrical connections 18 on opposite ends, a heat flow, depending on the polarity of the voltage source 17 and thus the energization of the Peltier element 2, occurs from the first side 12 to the second side 13 or vice versa.

Because of the flexible characteristic of the plate structure 6 the Peltier element 2 is likewise flexible. Because of this, thermal stresses that occur in particular during the operation of the Peltier element 2 or of the heat exchanger 1 can be removed. In addition to this, the Peltier element 2 is easily formable and can accordingly be adapted to different geometries.

The arrangement of the plate sections 9, 10 and of the legs 14 in this case results in that the Peltier element 2 is flexible in multiple directions, and can in particular remove thermal stresses in multiple directions.

When the Peltier element 2 is used in the heat exchanger 1 shown in FIG. 1, the first side 12 or the first plate sections 9 are electrically insulated via an electrically insulating, in particular dielectric, layer 19 relative to a first body of the heat exchanger 1, wherein the dielectric layer 19 is provided between the entire first side 12 of the Peltier element 2 and the first body 20. In addition, the second side 13 of the Peltier element 2 or the second plate sections 10 are electrically insulated relative to a second body 21 by means of such a layer 19, wherein the layer 19 is provided between the entire second side 13 and the second body 21. Here, the first side 12 of the Peltier element 2 is in heat-exchanging contact with the first body 20 and the second side 13 of the Peltier element 2 is in heat-exchanging contact with the second body 21. During the operation of the Peltier element 2 or of the heat exchanger 1, heat can thus be pumped from one of the bodies 20, 21 onto the other body 20, 21. When for example heat is pumped from the first body 20 onto the second body 21, the first body 20 serves as heat source and is cooled while the second body 21 serves as heat sink and is heated. This is possible by means of the Peltier element 2 even when in particular the first body 20 has a lower temperature than the second body 21. By reversing the energization of the Peltier element 2, the heat flow can be reversed so that the first body 20 serves as heat sink and the second body 21 as heat source. In the shown exemplary embodiment, the first body 20 is a metal plate 22 or a heat spreader 22', which allows a heat exchange that is more homogeneous over the area of the first body 22 between the Peltier element 2 or the first side 12 and the accumulator 5. This means that the first body 20 in the shown example is employed in order to temper a further object, here the accumulator 5, and to cool the same when the first body 20 is used as heat source. The second body 21 is configured as a body, in particular a tube body through which a flow can flow or a plate 24 through which a flow can flow, through which a temperature-control medium flows. This means that the temperature control means exchanges heat with the Peltier element 2 via the second body 21. The temperature control medium in the shown example serves for cooling the accumulator 5 so that the heat exchange between the temperature control medium and the accumulator 5 is amplified by means of the Peltier element 2 and the cooling of the accumulator thus improved. Analogously to this, it is possible, if necessary, to heat the accumulator 5 by reversing the energization of the Peltier element 2.

Figure 3:
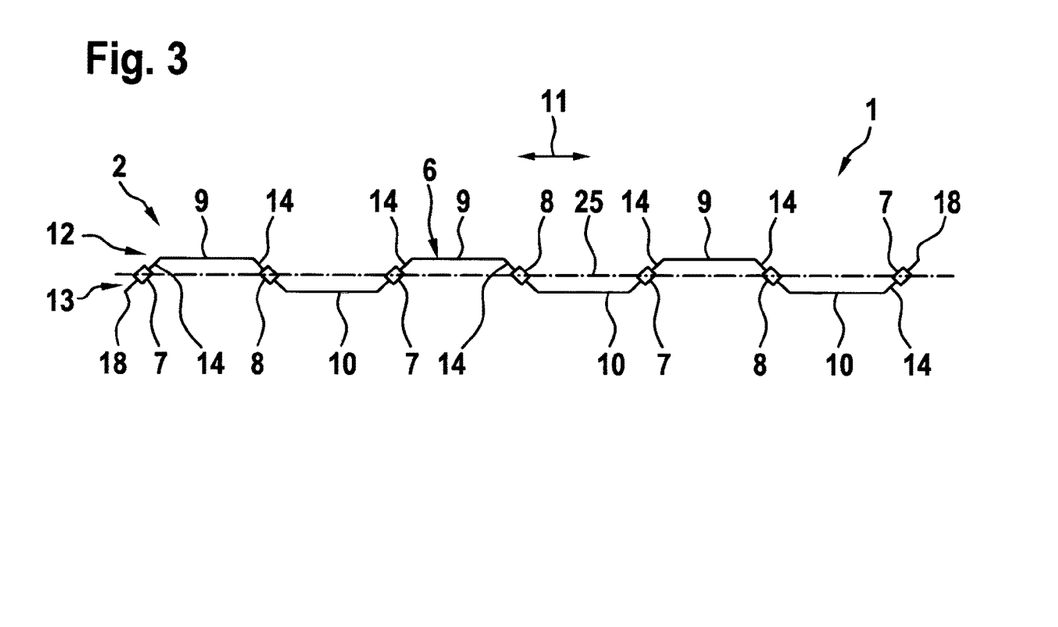

In FIG. 3, another exemplary embodiment of the Peltier element 2 from FIG. 2 is shown, which substantially differs from the exemplary embodiment shown in FIG. 2 in that the first side 12 of the Peltier element 2 is thermally separated from the second side 13 of the Peltier element 2 by a separating structure 25. This means that the separating structure 25 prevents or at least reduces the heat flow between first side 12 and second side 13. Because of this, the efficiency of the Peltier element 2 or of the heat exchanger 1 is improved since a direct exchange of heat between first side 12 and second side 13 is prevented or at least reduced. The separating structure 25 can furthermore create a fluidic separation between first side 12 and second side 13 of the Peltier element 2.

Figure 4:
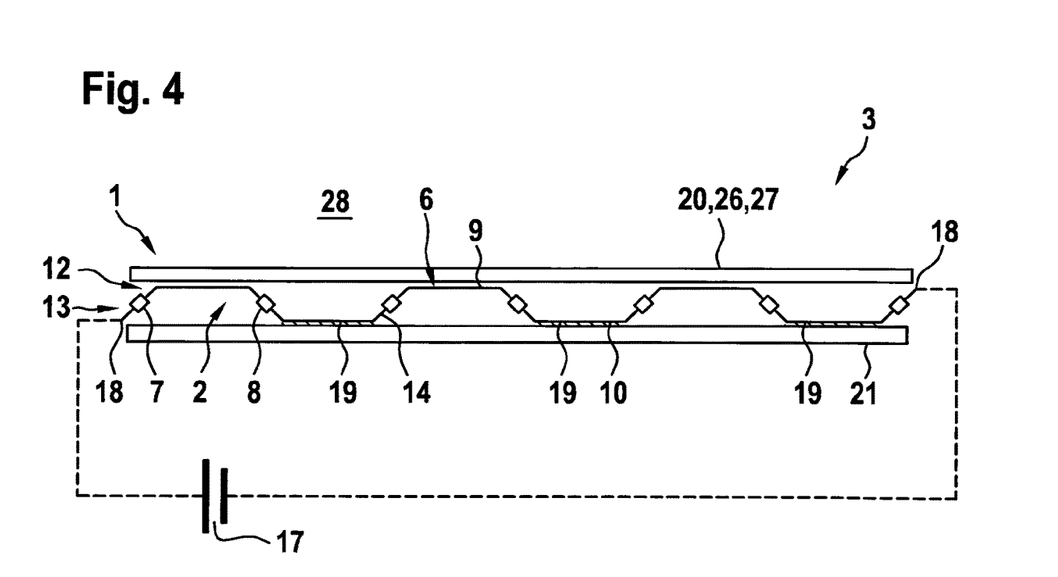

In FIG. 4, the heat exchanger 1 from FIG. 1 is shown in another exemplary embodiment. In this exemplary embodiment, the Peltier element 2 is employed for the direct temperature controlling of the body 20, 21. Here, the first body 20 is a textile 26, for example a cover 27 in the roof region of the associated motor vehicle 3, while the second body 21 is an external part of the body of the motor vehicle 3. In particular when the textile 26 is electrically insulating, the electrical insulation between the first plate sections 9 and the textile 26 can be omitted. The second side 13 or the second plate sections 10 are electrically insulated relative to the second body 21, wherein for this purpose such layers 19 are employed which are provided in sections between the respective second plate section 10 and the second body 21. With the help of the Peltier element 2, the heat exchanger 1 can thus be employed for temperature controlling the interior 21 of the motor vehicle 3 in that heat is pumped from the first body 20 and thus from the interior 28 onto the second body 21 and thus to the outside in order to cool the interior 28 or in that heat is pumped from the second body 21 onto the first body 20 and into the interior 28 in order to heat the interior 28.

Figure 5:
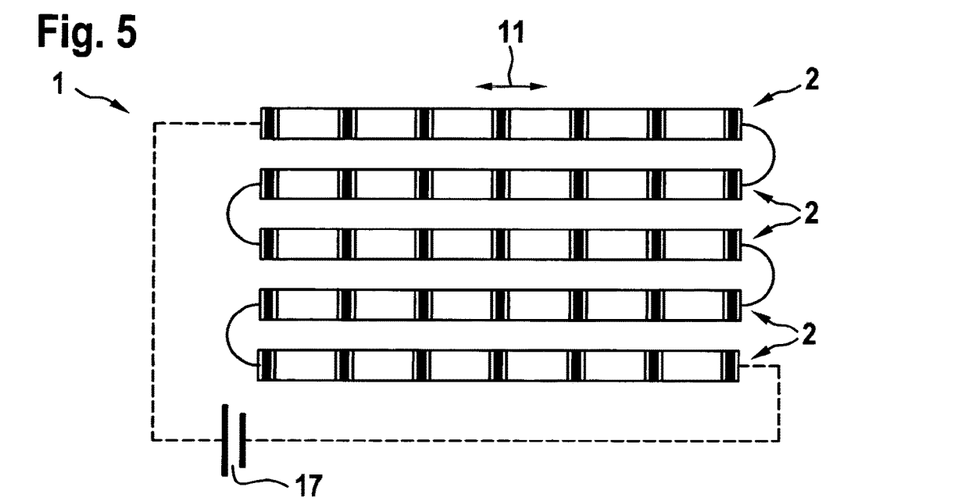

Another exemplary embodiment of the heat exchanger 1 is shown in FIG. 5, wherein in FIG. 5 a plan view multiple such Peltier elements 2 of the heat exchanger 1 are visible. It is evident that the Peltier elements 2 of the heat exchanger 1 are arranged parallel to one another, wherein the Peltier elements 2 are connected in series with one another and are energised via the same voltage source 17. Here it is conceivable to arrange the Peltier elements 2 in any way relative to one another and to connect the same in series. This allows using bodies 20, 21 of different geometries and/or sizes in the heat exchanger 1 or adapting the heat exchanger 1 to different spatial and geometrical circumstances.

Figure 6:
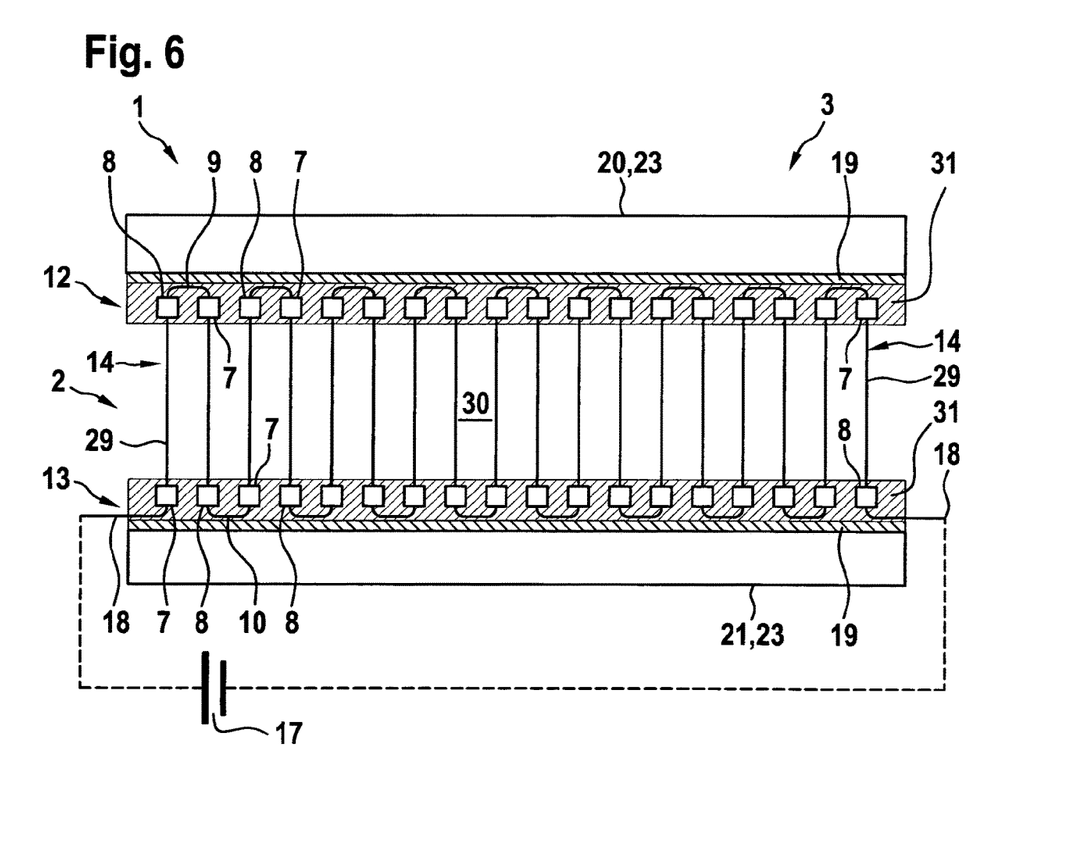

In FIG. 6, another exemplary embodiment of the heat exchanger 1 is shown with another exemplary embodiment of the Peltier element 2. Here it is evident that the legs 14 of the Peltier element 2 are all arranged in parallel and run transversely to the plate sections 9, 10. In the case of this Peltier element 2, two such semiconductors 7, 8, namely one such n-type semiconductor 7 and one such p-type semiconductor 8 are integrated in the respective leg 14, wherein the semiconductors 7, 8 of the respective leg 14 are arranged spaced from one another. Thus, a heat-exchanging section 29 is created in the respective leg 14 between the semiconductors 7, 8. In this exemplary embodiment, heat is exchanged between the sides 12, 13 and thus the plate sections 9, 10 of the Peltier element 2 on the one hand and the sections 29 of the legs 14 on the other hand. This means that both the first plate sections 9 and also the second plate sections 10 and thus both the first side 12 and also the second side 13 are heated during the operation of the Peltier element 2 while the sections 29 of the legs 14 are cooled or, upon a reversed energy supply of the Peltier element 2, the plate sections 9, 10 and thus both sides 12, 13 both the Peltier element 2 are cooled while the sections 29 of the legs 14 are heated. In the shown exemplary embodiment, the sections 29 of the legs 14 are arranged in a flow space 30 through which a fluid to be temperature-controlled flows. The sections 29 thus exchange heat with the fluid flowing through the flow space 30 during the operation of the Peltier element 2. In order to improve this heat exchange and/or enlarge the area exchanging heat with the fluid, the semiconductors 7, 8 of the respective leg 14 are arranged on the end side of the respective leg 14 or in the vicinity of the respective adjacent plate section 9, 10. Here, the semiconductors 7, 8 are arranged outside the flow space 30. This means that one of the semiconductors 7, 8 of the respective leg 14 is arranged on the first side 12 outside the flow space 30 and the other semiconductors 7, 8 is arranged outside the flow space 30 on the second side 13. The semiconductors 7, 8 arranged on the first side 12 and the first plate sections 9 are arranged in a thermally insulating block 31, in particular embedded, in order to achieve a suitable thermal separation between the flow space 30 and the first side 12 or the semiconductors 7, 8 which are arranged on the first side 12. Analogously to this, the second plate sections 10 and the semiconductors 7, 8 arranged on the second side 13 are arranged in a thermally insulating block 31, in particular embedded, in order to achieve a thermal separation between the second side 13 or the second plate sections 10 and the semiconductors 7, 8 arranged on the second side 13 and the flow space 30. The plate sections 9, 10 in this case protrude out of the block 31 on the side facing away from the flow space 30. In the heat exchanger 1, the plate sections 9 and thus the first side 12 are in heat-exchanging contact with the first body 20 via an electrically insulating layer 19. The second plate sections 10 and thus the second side 13 are in heat-exchanging contact with the second body 21 via a suitable electrically insulating layer 19. Thus, the Peltier element 2 can pump heat from the fluid flowing through the flow space 30 to the bodies 20, 21 in order to cool the fluid. Alternatively, heat can be pumped from the bodies 20, 21 onto the fluid by way of a reversed energy supply of the Peltier element in order to heat the fluid.

In the shown example, the bodies 20, 21 are each formed as tube bodies 23, through which a temperature control medium flows. Thus, a heat exchange between the fluid and the temperature control medium takes place in the heat exchanger 1, wherein the fluid and the temperature control medium are preferably fluidically separated from one another. Thus, in the shown exemplary embodiment a rib structure (not shown), which is usually provided between the tube bodies 23 conducting the temperature control medium is replaced with the Peltier element 2.

Figure 7:
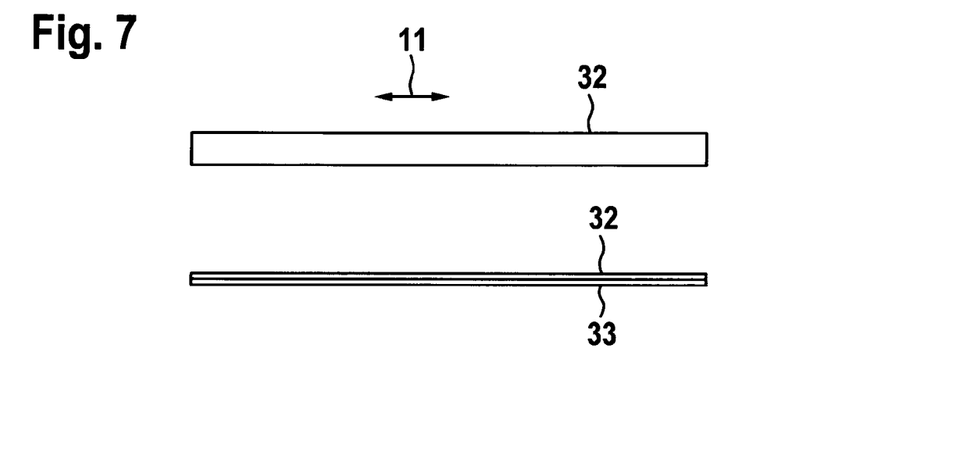
Figure 8:
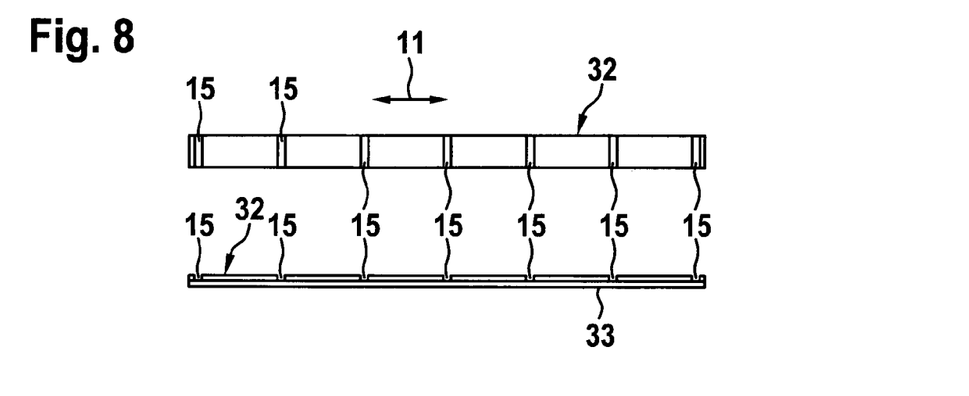
Figure 9:
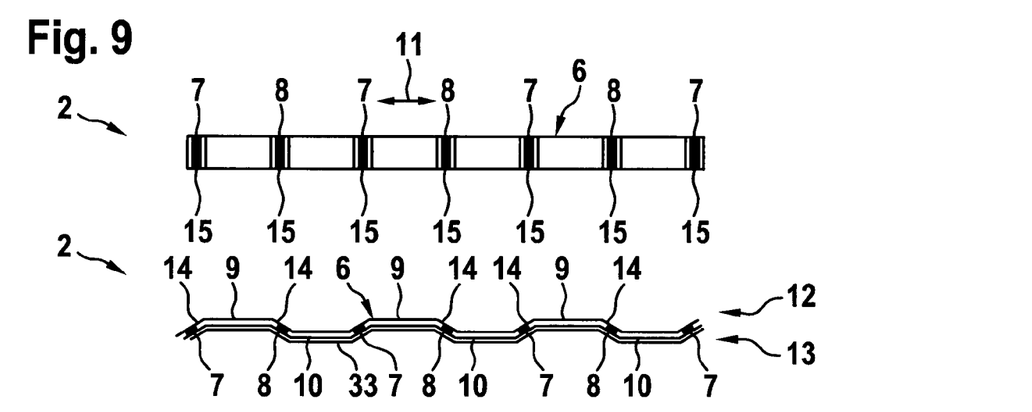

In FIGS. 7 to 9, various method steps for producing the Peltier element 2 shown in FIG. 2 are shown, wherein the respective figure in an upper view shows a plan view and in a lower view a lateral view.

According to FIG. 7, a plate 32 is initially made available which is formed strip-like. As is evident from the lower view of FIG. 7, the plate 32 is provided with a carrier plate 33 on a lower side, which serves for stabilising the plate 32, in particular in the following method steps. The carrier plate 33 is preferably formed to be electrically insulating.

According to FIG. 8, the plate 32 is provided with recesses 15 which are arranged in the extension direction 11 of the plate 32 in a parallel and equidistant manner. FIG. 8 shows that the recesses 15 in the shown example extend in both directions transversely to the extension direction 11 entirely through the plate 32 and thus bring about an interruption of the plate 32. These recesses 15 do not extend into the carrier plate 33 so that the regions of the plate 32 that are separated from one another remain fixed relative to one another.

Following this, n-type semiconductors 7 and p-type semiconductors 8 are alternately integrated in the recesses 15 in the extension direction 11. Following this, as is evident in particular in the lateral view of FIG. 9 a forming of the plate 32 provided with the semiconductors 7, 8 for producing the shown Peltier element 2 takes place.

Following this, the carrier plate 33 can be removed. This exemplary embodiment differs from the exemplary embodiment shown in FIG. 2 in particular in that the semiconductors 7, 8 do not protrude over the plate structure 7 or the associated legs 14. This means that the semiconductors 7, 8 do not protrude over the associated recesses 15 but terminate flush with the associated leg 14.

Alternatively, the carrier plate 10 can remain on the Peltier element 2 for forming another exemplary embodiment of the Peltier element 2. In this case, the carrier plate 10 serves on the one hand for the mechanical stabilisation of the Peltier element 2 and on the other hand for the electrical insulation of the second plate parts 10 or the second side 13, so that corresponding electrically insulating layers 19 shown in the preceding figures can be omitted.

Analogously to the procedure shown above in FIGS. 7 to 9, the Peltier element 2 shown in FIG. 6 can also be produced, wherein for this purpose in particular a different spacing of the recesses 50 and a different forming take place.

Introducing or integrating the semiconductors 7, 8 in the recesses 15 can be effected in any way. Conceivable, in particular, is a coating of the plate 32 or in the recesses 15 of the plate 32, for example by way of sputtering. It is also conceivable to insert already prefabricated semiconductors 7, 8 in the recesses 15.

Figure 10:
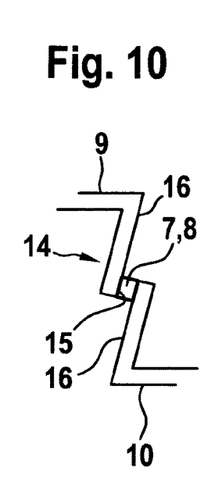

In FIG. 10 an exemplary embodiment is shown in the case of which the plate is initially formed, subsequently such a recess 15 provided and then fitted with the semiconductors 7, 8 for the integration of the semiconductors 7, 8 in the associated leg 14. In this exemplary embodiment, the leg 14 comprises two leg sections 16 which are offset relative to one another and extend parallel to one another.

Figure 11:
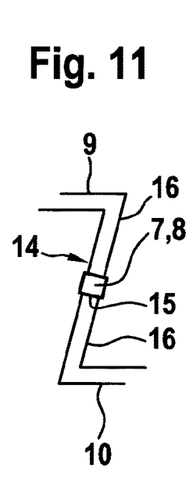

In FIG. 11, an exemplary embodiment is shown in the case of which the leg sections 16 are arranged aligned with one another, wherein the semiconductors 7, 8 protrudes over the recess 15 on both sides.

Figures 12, 13, 14:
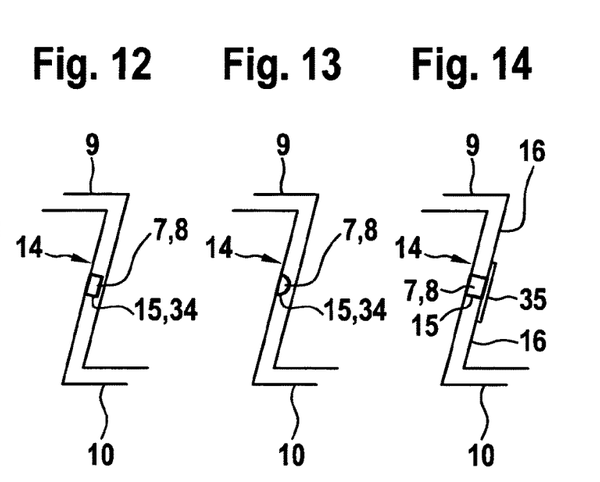

Another exemplary embodiment is shown in FIG. 12, in the case of which the plate 32 is not provided with a continuous recess 15 but with a recess 15 in the form of a groove 34, which is entirely filled with the semiconductors 7, 8. Because of this, no interruption is created in the leg 14 so that the leg 14 and thus the Peltier element 2 is mechanically more stable.

FIG. 13 shows an exemplary embodiment which differs from the exemplary embodiment shown in FIG. 12 in particular by the shape of the groove 34 and thus of the semiconductors 7, 8. While in the previously shown figures square semiconductors 7, 8 are visible, the semiconductors 7, 8 and the associated groove 34 in FIG. 13 are designed rounded.

In FIG. 14 an exemplary embodiment is shown in the case of which such a continuous recess 15 is provided, which subdivides the leg 14 into the leg sections 16. In addition, an electrically and/or thermally insulating reinforcement plate 34 is provided, which connects the leg sections 16 to one another on one side and thus mechanically stabilises the leg 14. Alternatively, the carrier plate 34 can be produced from a metal and/or be electrically conductive. Here it is conceivable in particular to initially place the semiconductors 7, 8 onto the carrier plate 35 and subsequently attach the carrier plate 35 together with the semiconductors 7, 8 to the leg 14.

Figure 15:
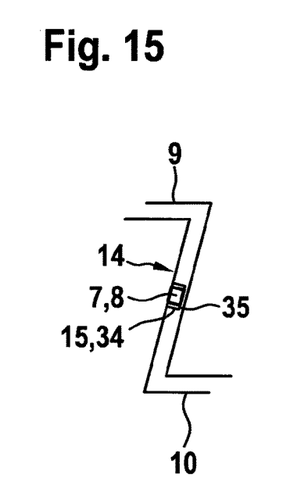
Figure 16:
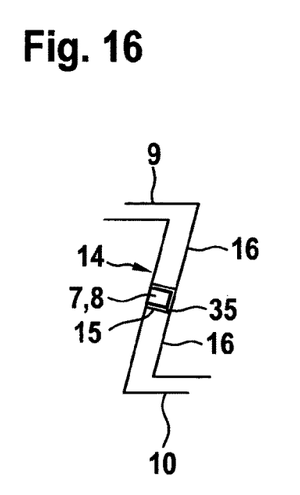
Figure 17:
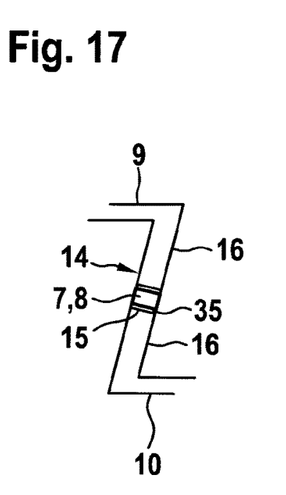

FIGS. 15 to 17 show embodiments in the case of which in each case such a carrier plate 35 is likewise employed, wherein in FIG. 15 such a recess 15 configured as groove 34 is visible, while in FIGS. 16 and 17 such a recess 15 which subdivides the leg 14 into two leg sections 16 is provided in each case. In these exemplary embodiments, the carrier plate 35 is greater in cross section than the associated semiconductors 7, 8.

The invention claimed is:

1. A Peltier element for a thermoelectric heat exchanger, comprising:
   a plurality of n-doped n-type semiconductors;
   a plurality of p-doped p-type semiconductors; and
   a plate structure for electrically contacting the semiconductors;
   wherein the plate structure includes first plate sections and second plate sections, which are alternately arranged along an extension of the Peltier element;
   wherein the first plate sections form a first side of the Peltier element, and the second plate sections form a second side of the Peltier element, the second side being spaced from the first side;
   wherein the plate structure includes a plurality of legs;
   wherein each leg extends from an associated first plate section to an associated second plate section such that each leg directly contacts and interconnects the associated first plate section and the associated second plate section, and each leg extends inclined relative to the associated first plate section and the associated second plate section;
   wherein the plurality of n-doped n-type semiconductors and the plurality of p-doped p-type semiconductors are alternately integrated in the plurality of legs along the plate structure;
   wherein a flow space, through which a fluid to be temperature-controlled is flowable, is disposed between the first plate sections and the second plate sections;
   wherein at least two insulating blocks extend along the extension of the Peltier element delimiting the flow space therebetween; and
   wherein the plurality of n-doped n-type semiconductors, the plurality of p-doped p-type semiconductors, the first plate sections, and the second plate sections are embedded within and thermally insulated from the flow space by the at least two insulating blocks.

2. The Peltier element according to claim 1, wherein the first side and the second side are arranged opposite each other.

3. The Peltier element according to claim 1, further comprising an electrical connection on opposite ends of the plate structure for the energy supply of the Peltier element.

4. The Peltier element according to claim 1, wherein the first side is at least one of thermally and fluidically insulated from the second side.

5. The Peltier element according to claim 1, wherein:
one n-type semiconductor of the plurality of n-doped n-type semiconductors and one p-type semiconductor of the plurality of p-doped p-type semiconductors are integrated in each of the plurality of legs;
one of the one n-type semiconductor and the one p-type semiconductor is arranged on the first side outside the flow space; and
the other of the one n-type semiconductor and the one p-type semiconductor is arranged on the second side outside the flow space.

6. A thermoelectric heat exchanger, comprising:
a Peltier element having:
a plurality of n-doped n-type semiconductors;
a plurality of p-doped p-type semiconductors; and
a plate structure for electrically contacting the semiconductors;
wherein the plate structure includes first plate sections and second plate sections, which are alternately arranged along an extension of the Peltier element;
wherein the first plate sections form a first side of the Peltier element, and the second plate sections form a second side of the Peltier element, the second side being spaced from the first side;
wherein the plate structure includes a plurality of legs;
wherein each leg directly contacts an associated first plate section and an associated second plate section interconnecting the associated first plate section and the associated second plate section, and each leg extends inclined relative to the associated first plate section and the associated second plate section;
wherein the plurality of n-doped n-type semiconductors and the plurality of p-doped p-type semiconductors are alternately integrated in the plurality of legs along the plate structure;
wherein the first side of the Peltier element is heat-transferringly connected with a first body;
wherein the second side of the Peltier element is heat-transferringly connected with a second body;
wherein an electrical insulation layer is arranged between at least one of the first side and the first body and between the second side and the second body;
wherein at least one of the first body and the second body define a flow channel extending therethrough through which a temperature control medium is flowable, the flow channel extending adjacent to an associated one of the first side and the second side;
wherein the associated one of the first side and the second side are disposed outside of the flow channel;
wherein at least two insulating blocks extend along the extension of the Peltier element and delimit a flow space therebetween, through which a fluid to be temperature-controlled is flowable; and
wherein the plurality of n-doped n-type semiconductors, the plurality of p-doped p-type semiconductors, the first plate sections, and the second plate sections are embedded within and thermally insulated from the flow space by the at least two insulating blocks.

7. The heat exchanger according to claim 6, wherein the at least one of the first body and the second body defining the flow channel is a tube body through which the temperature control medium flows in a through flow direction, and wherein the through flow direction extends substantially parallel to the extension of the Peltier element.

8. The heat exchanger according to claim 6, wherein:
one n-type semiconductor of the plurality of n-doped n-type semiconductors and one p-type semiconductor of the plurality of p-doped p-type semiconductors are integrated in each leg of the plurality of legs;
one of the one n-type semiconductor and the one p-type semiconductor is arranged on the first side outside the flow space, and the other of the one n-type semiconductor and the one p-type semiconductor is arranged on the second side outside the flow space;
the at least one of the first body and the second body defining the flow channel is a tube body through which the temperature control medium flows in a through flow direction; and wherein
the through flow direction extends substantially parallel to the extension of the Peltier element.

9. The heat exchanger according to claim 6, wherein at least one of the first body and the second body is a textile.

10. The Peltier element according to claim 1, wherein a n-type semiconductor of the plurality of n-type semiconductors and a p-type semiconductor of the plurality of p-type semiconductors is integrated in each of the plurality of legs, and wherein the n-type semiconductor is arranged in one of the at least two insulating blocks and the p-type semiconductor arranged in the other of the at least two insulating blocks such that each of the plurality of legs extend transversely across the flow space.

11. The Peltier element according to claim 1, wherein the plurality of n-doped n-type semiconductors and the plurality of p-doped p-type semiconductors are alternately disposed within a plurality of recesses disposed in the plurality of legs.

12. The Peltier element according to claim 1, wherein:
each of the plurality of legs have a first surface facing a flow direction of the fluid through the flow space and a second surface facing transversely to the flow direction; and
the first surface is narrower than the second surface.

13. The Peltier element according to claim 1, wherein:
the at least two insulating blocks have a respective first surface delimiting the flow space and a respective second surface on which an insulating layer is disposed, the first surface and the second surface disposed opposite one another;
a first subset of the plurality of n-doped n-type semiconductors, the plurality of p-doped p-type semiconductors, the first plate sections, and the second plate sections are embedded within a first insulating block of the at least two insulating blocks between the respective first surface and the respective second surface; and
a second subset of the plurality of n-doped n-type semiconductors, the plurality of p-doped p-type semiconductors, the first plate sections, and the second plate sections are embedded within a second insulating block of the at least two insulating blocks between the respective first surface and the respective second surface.

14. The heat exchanger according to claim 6, wherein the electrical insulation layer is at least one of:
arranged between a surface of the first side facing away from the second side and a surface of the first body facing the surface of the first side; and
arranged between a surface of the second side facing away from the first side and a surface of the second body facing the surface of the second side.

15. The heat exchanger according to claim 6, wherein:
- each of the plurality of legs has an outer contour defined by two first surfaces disposed opposite one another and two second surfaces disposed opposite one another, the two first surfaces connected to one another via the two second surfaces;
- the two first surfaces are narrower than the two second surfaces such that a distance between the two second surfaces is smaller than a distance between the two first surfaces; and
- one of the two first surfaces faces a flow direction of the fluid through the flow space and the two second surfaces face transversely to the flow direction.

16. The Peltier element according to claim 11, wherein at least one recess of the plurality of recesses disposed in a respective leg of the plurality of legs extends partially through the respective leg such that portions of the respective leg disposed on opposite sides of the at least one recess are directly connected to one another.

\* \* \* \* \*